March 11, 1969 O. W. HATCHER, JR 3,432,792

ISOLATED RESISTOR FOR INTEGRATED CIRCUIT

Filed Aug. 3, 1967

INVENTOR.
OWEN W. HATCHER, JR.
BY Flehr, Hohbach, Test, Albritton & Herbert
ATTORNEYS United States Patent Office 3,432,792

Patented Mar. 11, 1969

3,432,792

ISOLATED RESISTOR FOR INTEGRATED CIRCUIT

Owen W. Hatcher, Jr., Sunnyvale, Calif., assignor to Teledyne, Inc., Mountain View, Calif., a corporation of Delaware Filed Aug. 3, 1967, Ser. No. 658,154

U.S. Cl. 338—311

Int. Cl. H01c 7/00

2 Claims

ABSTRACT OF THE DISCLOSURE

A diffused isolated resistor for an integrated circuit. A moat is provided in a semiconductor substrate which is lined with an isolating dielectric layer of silicon dioxide. The moat is filled with polycrystalline N-type silicon. A P-type layer is diffused into the polycrystalline silicon and forms the diffused resistor.

The present invention is directed to an isolated resistor for an integrated circuit.

In providing a resistor in an integrated circuit, the resistor is normally formed by diffusion into an isolated region of an epitaxial layer which is on a semiconductive substrate. This diffusion is carried out at the same time as the diffusion of the base or emitter regions of associated transistors. FIGURE 1 is a cross-sectional view of a typical diffused resistor. It consists of the substrate 11, epitaxial layer 12, diffused resistor 13, passivating surface 14, and a contact 15.

Such a resistor inherently has parasitic resistance formed by layer 12 and substrate 11, and parasitic junction capacitances between the layers 11, 12 and 13. In addition, a parasitic transistor is formed with layer 12 as the base.

It is an object of the present invention to provide an improved resistor for an integrated circuit which obviates the foregoing problems.

It is another object of the invention to provide a resistor of the above type which is effectively isolated from its integrated circuit substrate.

Accordingly, there is provided a resistor for an integrated circuit comprising a semiconductive substrate having a moat therein with an insulating lining. A first semiconductive region comprising a material of a high resistivity substantially fills the moat. A second semiconductive region is inset in the first region and comprises material of a low resistivity relative to the material of the first region. At least a pair of ohmic contacts are connected at two spaced points on the second semiconductive region to provide terminals.

These and other objects of the invention will become more clearly apparent from the following description.

Referring to the drawing.

Figures 1, 2, 3, 4, 5, 6, 7, 8, 9, 10, 11:
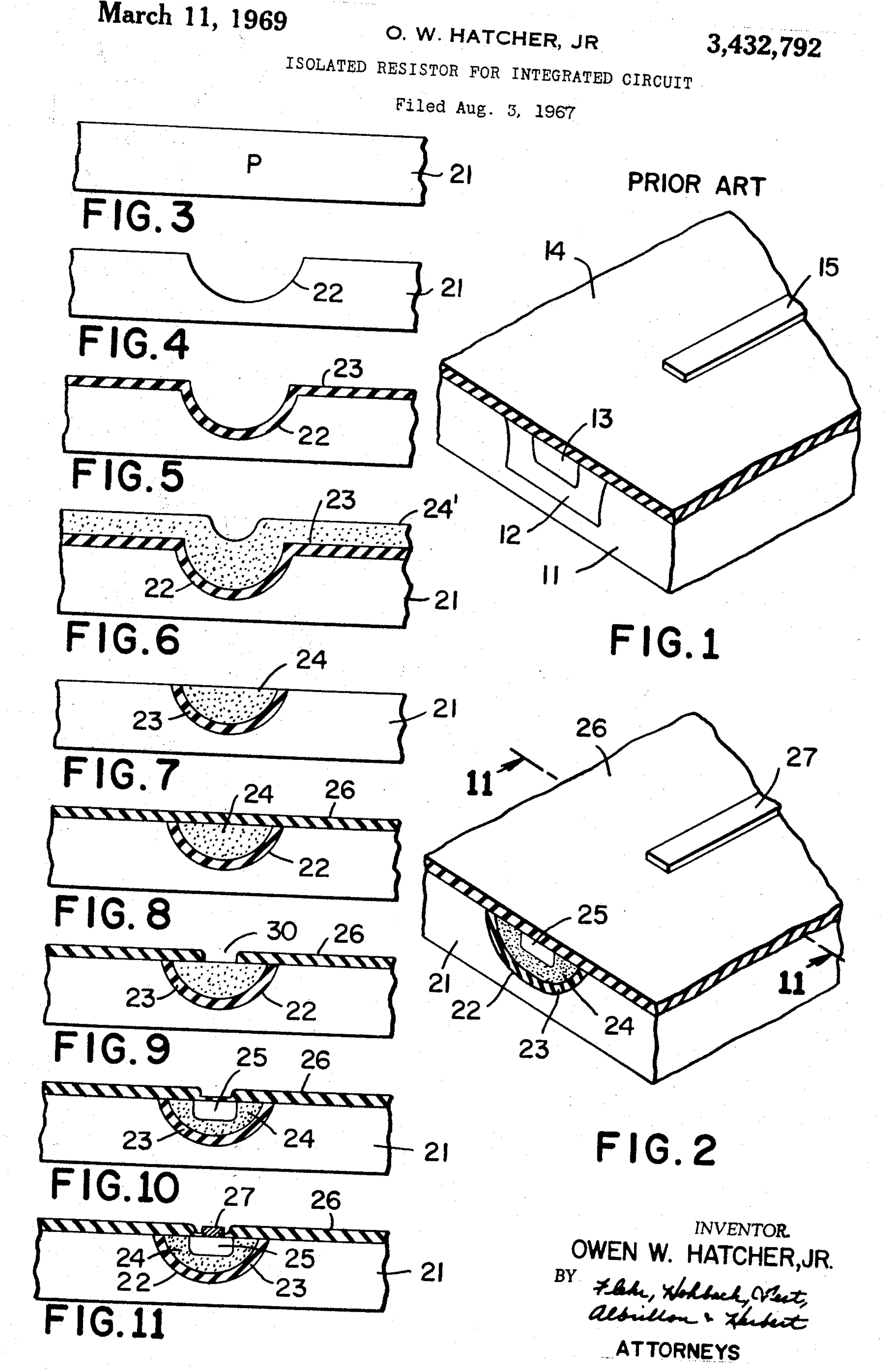
FIGURE 1 is a cross-sectional perspective view of a resistor embodying the prior art.
FIGURE 2 is a cross-sectional perspective view of a resistor embodying the present invention.
FIGURES 3 through 10 are cross-sectional views showing the processing steps necessary for the construction of the resistor of FIGURE 2.
FIGURE 11 is a cross-sectional view taken along the line 11—11 of FIGURE 2.

The final resistor as illustrated in FIGURES 2 and 11 includes a substrate 21 having a concave moat 22. Substrate 21 may be of either an N-type or P-type conductivity material. Moat 22 is lined with a dielectric material 23 such as silicon dioxide which has a relatively high dielectric constant and resistance. Moat 22 is filled with a material 24 having a high resistivity, such as polycrystalline-type silicon.

Inset into the first semiconductive region 24 is a second region 25 of, for example, P-type conductivity which is opposite to the N-type conductivity of region 24. Region 25 serves as the main resistive region of the resistor of the present invention. A passivating surface 26 overlays the entire structure. Contacts are provided at ends of the region 25; one contact 27 is shown at one end of region 25. A second spaced contact would also be provided.

The above structure is formed by the following process. Initially (FIGURE 3) a P-type substrate of single crystal silicon is provided. Moat 22 is etched into substrate 21 (FIGURE 4) and the moat is lined with a dielectric 23 such as silicon dioxide (FIGURE 5).

Moat 22 with the lining 23 of dielectric material is filled by an epitaxial method with a relatively high resistivity polycrystalline silicon 24′ which is lapped and polished to form the final semiconductive region 24 (FIGURE 7). This surface is allowed to form an oxidizing layer 26 over it (FIGURE 8) and a window 30 is etched in layer 26 as shown in FIGURE 9.

A P-type diffusion produces region 25 as shown in FIGURE 10; the amount of diffusion is controlled to produce the desired sheet resistance for the resistor. Lastly, contacts 27, one of which is shown, are installed as illustrated in FIGURE 11 to complete the resistor.

The resistor is isolated from other portions of the integrated circuit by the dielectric layer 23 which effectively minimizes any junction capacitance between polycrystalline silicon layer 24 and substrate 21. In addition, the parasitic resistance of substrate 21 is eliminated along with the parasitic transistor which would be formed by the three layers 21, 24 and 25 by the isolation provided by both dielectric layer 23 and polycrystalline layer 24.

From an equivalent circuit standpoint, the resistor of the present invention may be represented by two resistors in parallel, the first one of relatively low resistivity being provided by the region 25 and the second of relatively high resistivity by region 24. In view of the high resistivity of 24, it has a negligible effect on the overall resistance value desired for the integrated circuit. In other words, the total value of resistance is in essence determined by the sheet resistance of region 25. Furthermore, high current leakage from region 25 into region 24 is of no consequence because of its high resistance. It has been found that for optimum results this resistivity of region 24 should be at least ten times greater than the resistivity of region 25. Because of this resistivity relationship, region 25 need not be of the opposite conductivity type as region 24 to provide a reversed biased diode as in the prior art. Thus, as described by the present invention region 24 may be N type material with region 25 N+ type material.

Thus the present invention has provided an improved resistor for an integrated circuit which minimizes parasitic capacitances and resistances and the formation of a parasitic transistor which is inherent in prior art resistors of this type. The physical dimension of the resistors are very accurate since they are controlled by standard photomasking techniques. Moreover, since the resistor is contained wholly within the wafer, it causes no photomasking difficulties.

A resistor of the above description has been constructed with the following materials and having the following values of resistivity or sheet resistance:

Region 24—polycrystalline silicon (resistivity 40 ohm centimeters).

Region 25—P-type silicon (sheet resistance of 70 ohms per square).

I claim:

1. A resistor for an integrated circuit comprising, a semiconductive substrate having a moat therein, material having a high dielectric strength and lining said moat, a first semiconductive region comprising material having a high resistivity and substantially filling said moat, a second semiconductive region inset into said first region comprising material of a lower resistivity relative to said material of said first region and at least a pair of ohmic contact means connected at spaced points on said second semiconductive region.

2. A resistor for an integrated circuit as in claim 1 where said material of said first region is polycrystalline.

References Cited

UNITED STATES PATENTS 3,336,558 8/1967 Wright ---------- 338—311 X

LEWIS H. MYERS, *Primary Examiner.*

ELLIOT GOLDBERG, *Assistant Examiner.*

U.S. Cl. X.R.

29—620; 317—101; 338—260, 320